United States Patent [19]

McMunn, III et al.

[11] 3,809,797

[45] May 7, 1974

[54] SEAL RING COMPOSITIONS AND ELECTRONIC PACKAGES MADE THEREWITH

[75] Inventors: Charles William McMunn, III; Takashi Nakayama, both of Wilmington, Del.

[73] Assignee: E. I. du Pont de Nemours and Company, Wilmington, Del.

[22] Filed: Nov. 16, 1971

[21] Appl. No.: 199,236

[52] U.S. Cl................. 174/52 S, 106/1, 317/101 B, 174/68.5, 174/DIG. 3, 252/514

[51] Int. Cl............................................. H05k 1/02

[58] Field of Search............ 174/52 S, 68.5, DIG. 3; 317/101 A, 101 B, 101 C; 252/514; 106/1

[56] References Cited

UNITED STATES PATENTS

| | | | |
|---|---|---|---|
| 3,154,503 | 10/1964 | Janakirama-Rad et al. | 252/514 |
| 3,340,602 | 9/1967 | Hontz | 174/52 S |
| 3,539,114 | 11/1970 | Short | 252/514 X |
| 3,407,081 | 10/1968 | Ballard | 252/514 X |
| 3,509,430 | 4/1970 | Mroz | 174/DIG. 3 |
| 3,537,892 | 11/1970 | Milkovich et al. | 252/514 X |
| 3,615,731 | 10/1971 | Short | 252/514 X |
| 3,639,274 | 2/1972 | Brandt | 252/514 X |
| 3,673,117 | 6/1972 | Schroeder et al. | 252/514 X |
| 3,684,536 | 8/1972 | Hoffman | 252/514 X |

*Primary Examiner*—Bernard A. Gilheany
*Assistant Examiner*—A. T. Grimley

[57] ABSTRACT

Sealing compositions which can be cofired with dielectric layers to hermetically seal lids over semiconductor devices in electronic packages, said compositions comprising critical proportionate amounts of certain gold powders, certain metal resinates plus an inert vehicle. Optional are certain glass frits. Also electronic packages formed with such compositions and process of forming such packages. Optional features include a second layer of a certain gold powder over that formed from the above resinate-containing composition.

30 Claims, 2 Drawing Figures

INVENTORS
TAKASHI NAKAYAMA
CHARLES W. McMUNN III
BY James A. Forstner
ATTORNEY

SEAL RING COMPOSITIONS AND ELECTRONIC PACKAGES MADE THEREWITH

BACKGROUND OF THE INVENTION

This invention relates to electronic circuits, and more particularly, to sealing compositions useful in electronic packages.

Packages available for semiconductor devices (integrated circuits, medium scale integration or large scale integration) are of great variety. Useful for packaging semiconductor devices are single or multiple chip packages, exemplified by the dual in-line packages (DIP's). Single chip DIP's, for example, normally comprise a rectangular dielectric substrate (e.g., alumina); two series of thick film conductors printed on the substrate which converge from each of the long sides of the dielectric substrate toward its center; an optional chip cavity in the center of the substrate (the die may be eutectically attached to a gold pad on the substrate either in a substrate cavity or on the surface of cavity-free packages, or the die may be similarly bonded in a cavity or on the surface with epoxy); and a dielectric layer over all but the inner and outer extremities of the conductors. The semiconductor packages are usually made by printing refractory metals as the conductors, normally molybdenum, tungsten or molybdenum/manganese, on flexible (unfired) ceramic tape, placing another layer of tape over the conductors as desired, and thereafter cofiring the tape and conductors at 1,400°-1,750°C. in a reducing atmosphere, to produce a dense ceramic package with buried conductors. The top layer of tape normally is cut out to form a cavity permitting access by the semiconductor device to the buried metallizations. Finally, electrical leads are attached to the package and the package is then normally nickel and gold plated to provide oxidation resistance, increased conductivity and die and wire bonding capability, none of which are possible without gold plating.

The gold-plated thick-film refractory-metal conductors can accept die- and wire-bonded chips, beam-leaded chips, or flip chips, in the center of the substrate. The device and cavity are then normally covered with a gold-plated Kovar lid and sealed through a gold/-tin preform to a gold plated refractory metal seal ring on the package. It is desirable that the semiconductor device be hermetically sealed in the package. Prior art gold sealing compositions have been unsatisfactory due to lack of hermeticity of the seal, variations in gold plating adhesion to the refractory metal compositions, incompatibility of the refractory metal compositions during subsequent processing in air-firing operations, and due to frequency of failure because of shorting on firing. An object of this invention is to provide a metallic seal composition which will minimize failures, provide a hermetic seal and minimize shorting.

SUMMARY OF THE INVENTION

This invention is a screen-printable metallizing composition useful for producing a hermetic seal between a dielectric layer and a lid which covers a semiconductor device which is mounted on a substrate, said metallizing composition comprising, by weight, a. 70–94.5 percent gold powder, which consists essentially of a mixture of gold flakes approximately 1–10 microns across their widest surface and relatively spherical gold particles approximately 0.5–2 microns in diameter, the relative amounts of flakes to spheres, by weight, being 5–40 percent flakes and 60–95 percent spheres, b. one or more resinate compounds which are rhodium, chromium, tin or bismuth derivatives of pinene mercaptan, $(RS)_xM$, where R is the pinene radical, M is a metal and $x$ is the valence of M, said resinate compounds being present in an amount corresponding to 0.015–0.15 percent metal in said metallizing composition, and c. 5–20 percent of an inert liquid vehicle.

Preferred compositions comprise 84–90 percent (a), 0.015–0.06 percent (b), and 5–12 percent (c). Optional in these compositions is 0.5–5 percent of glass frit, by weight, based on the total weight of (a), (b), and (c). The glass frit consists essentially of, by weight, the operable and preferred ranges of constituents set forth in Table I.

TABLE I

| Constituent | GLASS FRITS Operable Range | Preferred Range |
|---|---|---|
| $SiO_2$ | 20–38% | 22–32% |
| PbO | 21–45% | 22–42% |
| $Al_2O_3$ | 1–25% | 9–13% |
| $TiO_2$ | 2–20% | 3–15% |
| BaO | 2–15% | 4–12% |
| ZnO | 0–25% | 0–20% |
| $PbF_2$ | 0–15% | 0–10% |
| SrO | 0– 5% | 0– 4% |
| $ZrO_2$ | 0– 5% | 0– 4% |
| $Ta_2O_5$ | 0– 5% | 0– 4% |
| $WO_3$ | 0– 5% | 0– 4% |
| CdO | 0– 5% | 0– 4% |
| $SnO_2$ | 0– 5% | 0– 4% |
| $Sb_2O_3$ | 0– 5% | 0– 4% |

This invention also involves a dielectric body having adherent thereto a layer produced by firing any of the above resinate-containing metallizing compositions. The dielectric body may additionally comprise a gold overprint layer, produced with a gold powder comprising spherical particles having a diameter in the range 1–10 microns, the powder having a bulk density within the range 5–9 g./cc. The overprint layer may be fired separately from the initial layer deposited via the above-described resinate-containing composition, or may be cofired with the same.

Also provided are packages for semiconductor chips which comprise a dielectric substrate (a) having conductor patterns (b) thereon; a dielectric layer (c) overprinted on selected areas of (a) and (b); and a seal ring (d) of the fired resinate compositions of this invention, adherent to selected areas of (c). An optional feature is the provision of an overprint layer of the gold powder comprising spherical particles, mentioned above. In either case, a semiconductor device (e) is bonded to the substrate (a cavity in the substrate is optional), the bonding being accomplished either with a glue such as an epoxy, or via a eutectic bond (such as gold/silicon). A lid (f) (described in detail below) is then placed over (e) and bonded through the seal ring (with or without overprint) to produce a hermetic package.

This invention also involves a process for hermetically encapsulating a semiconductor chip which is bonded to a dielectric substrate, said substrate having metallizations thereon, said process comprising a. depositing a dielectric layer of the frit of Table I over selected areas of said substrate and metallizations,
b. depositing a seal ring layer of the above-described resinate-containing metallizing compositions on selected areas of the dielectric layer deposited in step (a),
c. cofiring said dielectric layer and said seal ring to sinter the same, and
d. placing a lid and solder preform over said seal ring and firing the same.

The process may additionally comprise, between steps (c) and (d), the steps of e. overprinting the seal ring deposited in step (b) and fired in step (c) a gold overprint layer of gold powder in an inert vehicle, said gold powder comprising spherical particles having a diameter within the range 1-10 microns, the powder having a bulk density within the range 5-9 g./cc., and
f. firing said gold overprint layer to sinter the same. Alternately, the overprint layer may be printed on the seal ring deposited in step (b) and cofired therewith.

DETAILED DESCRIPTION OF THE INVENTION

Figure 1:
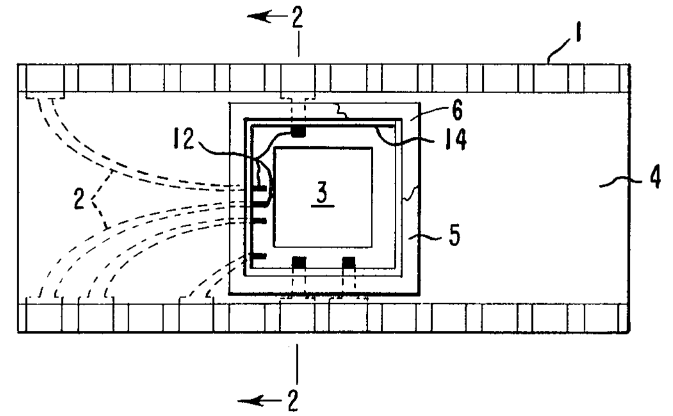
FIG. 1 is an overhead view of a dual in-line package for semiconductor device.
Figure 2:
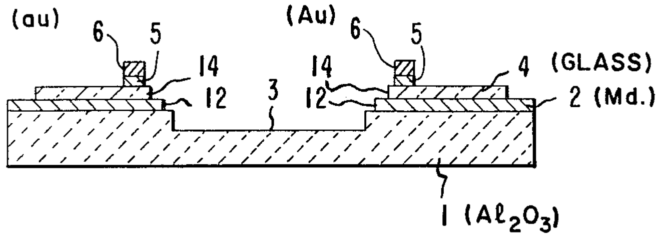
FIG. 2 is a cross-sectional view of the package of FIG. 1, taken along the line 2—2 in FIG. 1.

Referring to the drawing, 1 is a rectangular dielectric substrate having conductor metallization fingers 2 (only some of which are shown) printed thereon in a desired pattern, the pattern converging toward a cavity 3 in the center of the substrate 1. (The cavity is optional in this invention.) Over 1 and 2 is printed a dielectric layer 4 (covering all but the inner and outer extremities of each finger 2) and over 4 is the gold seal ring 5 of the present invention. The edge 14 of the dielectric layer 4 is so disposed that it extends beyond the seal ring 5, but does not cover extremities 12 of fingers 2.

The screen printable sealing compositions of the present invention comprise certain gold powder, certain metal resinates, and inert liquid vehicle, in the critical proportionate amounts set forth above. Optional in the sealing composition is the glass frit of Table I, in amounts also set forth above. A further optional ingredient is an inert liquid thinner for the resintate.

It has been found that gold powder produced according to the process of commonly assigned Short and Weaver U.S. Ser. No. 159,486, filed on July 2, 1971, can be used as the gold powder in the resinate-containing compositions. It consists essentially of a mixture of gold flakes approximately 1-10 microns across their widest surface and relatively spherical gold particles which are approximately 0.5-2 microns in diameter. Preferred proportions of flakes to spheres by weight are about 20 percent flakes and 80 percent spheres, although 5-40 percent flakes and 60-95 percent spheres may be used. The powder may be prepared, as disclosed in U.S. Ser. No. 159,486, by precipitation from an acid gold chloride solution by reaction with reducing agents comprising (a) at least one member selected from the group consisting of oxalic acid and the alkali metal salts of oxalic acid, and (b) at least one member selected from the group consisting of hydroquinone, bromo, chloro, and lower alkyl substituted derivatives thereof, in the presence of a protective colloid, at a temperature within the range of 50°-100°C. The colloid used was gum arabic.

Conventional spherical gold powders have not been found useful as single-print seal ring metallizations, since wetting of gold/tin solder preforms does not occur and/or shorting results upon cofiring of the dielectric layer and the seal ring, due to fissuring of the former. The fissuring seems to be due to excessive shrinkage of powders of such spherical gold particles during firing, resulting in development of stresses at the seal ring/dielectric layer interface which tear the dielectric. Conductor compositions subsequently applied to the part flow into the dielectric layer fissures, resulting in electrical shorts between conductor and seal ring.

The resinate is one or more of the rhodium, chromium, tin or bismuth derivatives of mixed pinene mercaptans, $(RS)_xM$, where R is the pinene radical, M is the metal, and $x$ is the valence of M. As an example of such resinates, rhodium resinate is a rhodium mercaptide obtained by the reaction of rhodium chloride with mixed organic thiols. The organic thiols can be prepared, for example, by (1) oxidizing pinenes with sulfur, followed by reduction with hydrogen to give mixed pinene mercaptans or (2) adding hydrogen sulfide to pinenes to give mixed pinene mercaptans directly. The following two structures are typical, but not exhaustive, of various mixed pinene mercaptans:

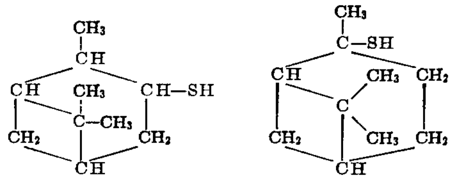

Rhodium mercaptides may be, e.g., $Rh(SR)_2$. The amount of resinate in the composition, where M is Rh may alternately be expressed as 0.5-5.0 percent resinate in the composition.

The particular metal employed in the resinate is critical; e.g., the corresponding vanadium resinate does not produce satisfactory seals. To be effective the metal in the resinate must tend to retard shrinkage of the gold particles during sintering, to prevent the fissuring mentioned above. The presence of the metal also should have the effect of decreasing the overall grain size of the sintered gold film. It was discovered that introduction of the metal as derivatives of pinene mercaptan was excellent, since the resultant resinate of metal and pinene mercaptan is compatible with organic screen printing vehicles and since pinene mercaptan does not leave organic residues upon firing at temperatures in the range 700°-1,000°C. and gave uniform distribution of metal in the composition.

The vehicle may be any one of a number of inert vehicles useful for screen printing, with or without thickening and/or stabilizing and/or other common additives. Examples of liquids which can be used are organic liquids such as aliphatic alcohols; esters of alcohols, e.g., the acetates and propionates; terpenes such as pine oil and alpha- and beta-terpineol; solutions of resins such as polymethacrylates of lower alcohols, or solutions of ethyl cellulose, in solvents such as terpenes, etc.

Exemplary of useful liquid thinners are trichloroethylene, terpentine, beta-terpineol, ect. The amounts of such thinners are not critical, so long as adequate print definition is obtained.

The optional frit which may be employed in the sealing compositions of the present invention are the partially crystallizable glasses disclosed in Hoffman U.S. Pat. No. 3,586,522, issued June 22, 1971. The composition is set forth above.

The packages of the present invention will normally be produced by screen printing the dielectric layer, and then the sealing composition, onto a pre-fired composite substrate which bears pre-fired metallizations. At this point the dielectric layer and sealing composition are cofired at a temperature above 800°C. in the event that the semiconductor device is to be glued to the substrate, e.g., with epoxy. If a eutectic die bond is to be employed instead of epoxy cement, normally a gold die bonding pad is applied to the substrate and cofired with the seal ring and dielectric layer.

Thereafter, the semiconductor device is bonded to the substrate, and a solder preform is placed over the seal ring; a gold-plated Kovar lid (or lid of another material of good expansion match with the dielectric) is placed over the preform; the package is hermetically sealed at about 350°C. in the case of such a gold-plated Kovar lid. The temperature will vary depending on the sealing solder employed and the type of lid used. Gold-plated Kovar is not the only material that can be used as a lid. Copper-, tin-, silver- and nickel-plated Kovar have also been found acceptable. Tin, silver and nickel metal can also be used. Alternately, the lid can also be ceramic, which has been metallized to wet the solder preform. One such lid is 96 percent $Al_2O_3$ metallized with a conductive molybdenum composition and gold plated to achieve solder wetting.

An optional feature in the process, package and seal ring system of the present invention is a second gold layer over the seal ring layer described above, that is, an overprint layer. If the second layer is to be employed in this invention, certain critical gold powders are used, and are printed in vehicle (no frit or resinate). The second layer may be fired separately from the first layer, or may be cofired therewith.

The gold powder used in the second layer is that prepared according to the process of Short U.S. Ser. No. 143,249, filed May 13, 1971, and comprises spherical particles having a particle diameter within the range 1–10 microns, the powder having a bulk density within the range 5–9 g./cc. Such powders may be prepared by precipitating the gold from an aqueous gold chloride solution by rapidly adding an excess amount of reducing agent (potassium and/or sodium sulfite) while agitating the solution at 0°–30°C. The powder used for the second layer normally has a surface area in the range 0.10–0.15 $m^2/g$. The vehicle used in printing the second or overprint gold layer is that described above for printing the resinate-containing gold composition of this invention.

The following examples and comparative showings are presented to illustrate the present invention. Both below and elsewhere in the specification and claims, all parts, percentages and ratios are by weight, unless otherwise stated.

EXAMPLES 1–7

Showings A and B

Set forth in Table II are the proportions and types of resinate, gold powder and vehicle (and frit, if any) used in several examples of the present invention and in two comparative showings using a different gold powder, each employing a single print seal ring system. The gold powder used in the examples of this invention was a mixture of flakes and spheres (about 20/80 ratio by weight, 10 micron diameter flakes and 1 micron spheres) prepared according to U.S. Ser. No. 159,486. The gold powder containing only spheres, used in the comparative showings, had a particle size of about 1 micron and was prepared according to the process of U.S. Ser. No. 143,249.

The resinates used in the examples were mercaptides and are commercially available from Engelhard Industries.

The frit used in the gold compositions had the following composition: 8% BaO, 11% $Al_2O_3$, 30% $SiO_2$, 9% $TiO_2$, 10% ZnO, and 32% PbO. The vehicle used contained about 10 percent ethyl cellulose, about 10 percent rosin, 38 percent beta-terpineol, 19 percent kerosene, 19 percent "Magie Oil 470," an aliphatic hydrocarbon sold by Magie Brothers Chemical Company, and 5 percent wax. The thinner contained about 2 parts of a mixture of alpha- and beta-terpineols, 1 part kerosene and 1 part "Magie Oil 470."

Several metallized substrates for dual-in-line packages were prepared by printing Pd/Ag or Au metallizations on a prefired 60-mil thick alumina substrate (2.45 by 0.52 inch) having a 15-mil deep cavity 0.2 inch square on its center, and then firing the metallization. Thereafter a dielectric layer about 4-mil thick was printed over selected portions of the metallized substrate, but not over the cavity. The dielectric composition was printed as a paste of 73 parts of glass frit per part inert liquid vehicle. The frit had the composition of that used in the metallizing composition described above. The seal ring composition in each case was prepared in a Hoover mill from the materials set forth in Table II, and screen printed (single print, No. 200 screen) on the dielectric layer near its periphery adjacent to the substrate cavity. The entire assembly was then fired at the temperature set forth in Table II. The fired seal rings typically had a thickness of 0.5 mil. The objects of Showings A and B did not wet the Au/Sn preforms. The objects of Examples 1–7 exhibited no fissures; they did wet the Au/Sn preforms. Semiconductor devices are then die bonded in the cavity either by epoxy sealants or by eutectic die bonding to a gold pad at the bottom of the cavity. A gold/tin (80/20) preform about 1.5 mil thick was then placed over the seal ring and a gold-plated

TABLE II

SINGLE LAYER SEAL RING SYSTEMS (Parts by Weight)

| | Ex. 1 | Show. A | Ex. 2 | Show. B | Ex. 3 | Ex. 4 | Ex. 5 | Ex. 6 | Ex. 7 |
|---|---|---|---|---|---|---|---|---|---|
| Flux | | | | | | | | | |
| Type | Rh | Rh | Cr | Cr | Sn | Rh | Rh | Bi | Bi |
| Amount | 0.1 | 0.1 | 0.1 | 0.1 | 0.1 | 0.1 | 0.2 | 0.1 | 0.1 |
| Gold | | | | | | | | | |
| Type* | f/s | s | f/s | s | f/s | f/s | f/s | f/s | f/s |
| Amount | 8.9 | 8.9 | 8.9 | 8.9 | 8.8 | 8.8 | 8.7 | 8.8 | 8.9 |
| Vehicle | 1.0 | 0.7 | 1.0 | 0.7 | 1.0 | 1.0 | 1.0 | 1.0 | 1.0 |
| Thinner | — | 0.3 | — | 0.3 | — | — | — | — | — |
| Firing Temp.** (°C.) (Dielectric and seal ring) | 890 | 890 | 890 | 890 | 870 | 890 | 880 | 890 | 890 |
| Frit | — | — | — | — | 0.1 | 0.1 | 0.1 | 0.1 | — |

* f/s means gold powder containing flakes and spheres. s means gold powder containing only spheres.
** Firing schedule included 10 minutes to achieve peak temperature indicated in Table II, followed by 10 minutes at the indicated peak temperature.

Kovar metal (Fe-Ni-Co alloy) lid was placed over the preform. Bonding was accomplished at 350°C., 2 minutes (total firing cycle 30 minutes). Hermetic units without fissures were reproducibly produced. Hermeticity was confirmed by a gross leak test and a fine leak test. In the gross leak test the part is immersed in a hot fluorocarbon solvent bath (Du Pont Freon fluorocarbon FC-43, 125° ± 5°C.); a microscope was used to detect bubbles in a 2-minute time period. Where no bubbles are detected at 7X, the part passes the gross leak test. (Military Std. 883 Method 1,014.) The fine leak test is accomplished by pressurizing the part in helium gas at 50 psi for 4 hours. Then the helium leak rate is measured with a CEC Consolidated Electrodynamics helium detector type 24-120B (helium sensitivity, $3 \times 10^{-10}$ cc. helium/sec.). If the helium leak rate from the part is less than $5 \times 10^{-8}$ cc. He/sec., the part is considered to have passed the fine leak test. Resistance to thermal shock was examined as follows. The part is subjected to to 15 cycles of 5 minutes at +150°C. in liquid glycerin, followed immersion in a −65°C. environment (Dry Ice/acetone); each temperature change is accomplished within 10 seconds. (Mil. Std. 883 Method 1,011, Condition C) Thereafter the gross and fine leak tests are repeated. Where the part passes these tests, it is said to be "hermetically sealed." In almost every instance the objects produced according to the present invention passed each test (5 of 5, or 10 of 10 runs).

Comparative Showing C

Single layer seal rings prepared similarly to Example 1, but using vanadium resinate instead of rhodium resinate, failed due to fissuring during cofiring of the dielectric layer and gold seal ring.

Comparative Showing D

Objects having single layer seal rings prepared using the gold of Example 1, but no resinate, also resulted in fissuring, as in Showing C.

Comparative Showing E

Another single print seal ring system which was found to be inoperative is as follows. The gold powder employed was neither of those set forth in Table II, but was composed of small spheres having a surface area of 0.3 $m^2/g$. A mixture was prepared as above from 80.5 parts of the gold, 6.0 parts frit of Examples 3–6, 8.0 parts vehicle of Examples 1–7, 0.5 part soya lecithin thinner and 5.0 parts dibutyl phthalate (vehicle). Seal rings were printed as before and cofired with the dielectric layer at 870°C. for 10 minutes. No seal was made since no solder wetting on the seal ring occured.

Comparative Showing F

A single print seal ring layer was prepared as in Example 1, using the following in the seal-ring composition: 83 parts of the spherical gold of Showing A, 4.0 parts of a frit, 5.0 parts $Bi_2O_3$ and 8 parts of the vehicle of Example 1. The frit contained 65% PbO, 34% $SiO_2$ and 1% $Al_2O_3$. Firing at 870°C. for 10 minutes gave the same results as Showing E.

Comparative Showing G

A single print seal ring was prepared with a frit other than that of the present invention, using the following metallizing composition: 89 parts of the gold of Example 1, 9 parts of the vehicle of Example 1, and 2 parts of a frit (3.9% CaO, 0.8% BaO, 27.7% BaO, 21.7% $SiO_2$, 26.7% $B_2O_3$, 8.7% $Na_2O$, 0.7% PbO, 5.8% $Al_2O_3$ and 4.0% $ZrO_2$). Firing at 870°C. for 10 minutes did not result in wetting.

Comparative Showing H

A two-print system which failed used the initial print of Showing E plus an overprint of the gold of Showing A (90 parts gold, 10 parts of the vehicle of Example 1), each layer being cofired at 870°C. for 10 minutes with the dielectric layer. The product was not hermetic.

EXAMPLE 8

A two-print system of the present invention employed the following resinate-containing gold powder as the first layer: 26.4 parts of the gold of Example 1, 0.3 part of the frit of Example 1, 3.0 parts of the vehicle of Example 1, and 0.3 part of the rhodium resinate of Example 1. The overprint was that of Showing H. The two gold layers were cofired with the dielectric layer at 890°C. for 10 minutes. Ten of 10 products were hermetic.

We claim:

1. A screen-printable metallizing composition useful for producing a hermetic seal between a dielectric layer and a lid which covers a semiconductor device which is mounted on a substrate, said metallizing composition comprising, by weight, a. 70–94.5 percent gold powder, which consists essentially of a mixture of gold flakes approximately 1–10 microns across their widest surface and relatively spherical gold particles approximately 0.5–2 microns in diameter, the relative amount of flake to spheres, by weight, being 5–40 percent flakes and 60–95 percent spheres, b. one or more metal resinate compounds which are derivatives of pinene mercaptan, $(RS)_xM$, where R is the pinene radical, M is a metal selected from the group consisting of rhodium, chromium, tin or bismuth and $x$ is the valence of M, said resinate compounds being present in an amount corresponding to 0.015–0.15 percent metal in said metallizing compositions, and c. 5–20 percent of an inert liquid vehicle.

2. A composition according to claim 1 comprising 84–90 percent (a), 0.015–0.06 percent (b), and 5–12 percent (c).

3. A composition according to claim 2 which additionally comprises 0.5–5 percent by weight glass frit, based on the total weight of (a), (b) and (c); said glass frit consisting essentially of, by weight, 20–38% $SiO_2$
21–45% PbO
1–25% $Al_2O_3$
2–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$ 4. A composition according to claim 3 wherein said glass frit consists essentially of, by weight, 22–32% $SiO_2$
22–42% PbO
9–13% $Al_2O_3$
3–15% $TiO_2$
4–12% BaO
0–20% ZnO
0–10% $PbF_2$
0–4% SrO
0–4% ZrO
0–4% $Ta_2O_5$
0–4% $WO_3$
0–4% CdO
0–4% $SnO_2$
0–4% $Sb_2O_3$ 5. A composition according to claim 1 which additionally comprises 0.5–5 percent by weight glass frit, based on the total weight of (a), (b) and (c); said glass frit consisting essentially of, by weight, 20–38% $SiO_2$
21–45% PbO
1–25% $Al_2O_3$
2–20% $TiO_2$
2–15% BaO
0–25% ZnO 0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$ 6. A composition according to claim 5 wherein said glass frit consists essentially of, by weight, 22–32% $SiO_2$
22–42% PbO
9–13% $Al_2O_3$
3–15% $TiO_2$
4–12% BaO
0–20% ZnO
0–10% $PbF_2$
0–4% SrO
0–4% ZrO
0–4% $Ta_2O_5$
0–4% $WO_3$
0–4% CdO
0–4% $SnO_2$
0–4% $Sb_2O_3$ 7. A dielectric body having adherent thereto a metallic layer of a fired metallizing composition, said metallizing composition comprising, by weight, a. 70–94.5 percent gold powder, which consists essentially of a mixture of gold flakes approximately 1–10 microns across their widest surfaces and relatively spherical gold particles approximately 0.5–2 microns in diameter, the relative amount of flakes to spheres, by weight, being 5–40 percent flakes and 60–95 percent spheres, b. one or more metal resinate compounds which are derivatives of pinene mercaptan, $(RS)_xM$, where R is the pinene radical, M is a metal selected from the group consisting of rhodium, chromium, tin or bismuth and $x$ is the valence of M, said resinate compounds being present in amount corresponding to 0.015–0.15 percent metal in said metallizing compositions, and c. 5–20 percent of an inert liquid vehicle.

8. A dielectric body according to claim 7, having adherent thereto a metallic layer wherein said metallizing composition comprises 84–90 percent (a), 0.015–0.06 percent (b), and 5–12 percent (c).

9. A dielectric body according to claim 8 having adherent thereto a metallic layer wherein said metallizing composition additionally comprises 0.5–5 percent by weight glass frit, based on a total weight of (a), (b), and (c); said glass frit consisting essentially of, by weight, 20–38% $SiO_2$
21–45% PbO
1–25% $Al_2O_3$
2–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$

10. A dielectric body according to claim 9 which in addition comprises, over said metallic layer, a gold overprint layer.

11. A package for semiconductor chips comprising a dielectric body according to claim 9 wherein said dielectric body comprises a dielectric substrate (a) having conductor patterns (b) thereon; a dielectric layer (c) overprinted on selected areas of (a) and (b); and a seal ring (d) of said metallizing composition adherent to selected areas of dielectric layer (c).

12. A package according to claim 11 additionally comprising a gold overprint layer.

13. A dielectric body according to claim 8 which in addition comprises, over said metallic layer, a gold overprint layer.

14. A package for semiconductor chips comprising a dielectric body according to claim 8 wherein said dielectric body comprises a dielectric substrate (a) having a conductor pattern (b) thereon; a dielectric layer (c) overprinted on selected areas of (a) and (b); and a seal ring (d) of said metallizing composition adherent to selected areas of dielectric layer (c).

15. A package according to claim 14 additionally comprising a gold overprint layer.

16. A dielectric body according to claim 7 which in addition comprises, over said metallic layer, a gold overprint layer.

17. A package for semiconductor chips comprising a dielectric body according to claim 7, wherein said dielectric body comprises a dielectric substrate (a) having conductor patterns (b) thereon; a dielectric layer (c) overprinted on selected areas of (a) and (b); and a seal ring (d) of said metallizing composition adherent to selected areas of dielectric layer (c).

18. A package according to claim 17 additionally comprising a gold overprint layer.

19. A semiconductor package according to claim 15 which additionally comprises a semiconductor device (e) bonded to substrate (a); and a lid (f) covering device (e) and bonded through the fired composition of claim 1 and a solder preform to dielectric layer (c).

20. A dielectric body having adherent thereto a metallic layer wherein said metallizing composition additionally comprises 0.5–5 percent by weight glass frit, based on the total weight of (a), (b), and (c); said glass frit consisting essentially of, by weight 20–38% $SiO_2$
21–45% PbO
1–25% $Al_2O_3$
2–20% $TiO_2$
2–15% BaO
0–25% ZnO
0–15% PbF
0–5% SrO
0–5% $ZrO_2$
0–5% $Ta_2O_5$
0–5% $WO_3$
0–5% CdO
0–5% $SnO_2$
0–5% $Sb_2O_3$.

21. A dielectric body according to claim 20 which in addition comprises, over said metallic layer, a gold overprint layer.

22. A package for semiconductor chips comprising a dielectric body according to claim 20 wherein said dielectric body comprises a dielectric substrate (a) having conductor patterns (b) thereon; a dielectric layer (c) overprinted on selected areas of (a) and (b); and a seal ring (d) of said metallizing composition adherent to selected areas of dielectric layer (c).

23. A semiconductor package according to claim 22 which additionally comprises a semiconductor device (e) bonded to substrate (a); and a lid (f) covering device (e) and bonded through the fired composition and a solder preform to dielectric layer (c).

24. A package according to claim 22 additionally comprising a gold overprint layer.

25. A process for hermetically encapsulating a semiconductor chip which is bonded to a dielectric substrate, said substrate having metallizations thereon, said process comprising a. depositing a dielectric layer of a frit over selected areas of said substrate and metallizations wherein said frit consists essentially of, by weight 20–38% $SiO_2$
21–45% PbO
1–25% $Al_2O_3$
1–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$ b. depositing a seal ring layer of a metallizing composition on selected areas of the dielectric layer deposited in step (a), wherein said metallizing compositions comprises, by weight, a. 70–94.5 percent gold powder, which consists essentially of a mixture of gold flakes approximately 1–10 microns across their widest surface and relatively spherical gold particles approximately 0.5–2 microns in diameter, the relative amount of flakes to spheres, by weight, being 5–40 percent flakes and 60–95 percent spheres, b. one or more metal resinate compounds which are (rhodium, chronium, tin or bismuth) derivatives of pinene mercaptan, $(RS)_xM$, where R is the pinene radical, M is a metal selected from the group consisting of rhodium, chromium, tin or bismuth and $x$ is the valence of M, said resinate compounds being present in an amount corresponding to 0.015–15 percent metal in said metallizing compositions, and c. 5–20 percent of an inert liquid vehicle, c. cofiring said dielectric layer and said seal ring to sinter the same, and d. placing a lid over said seal ring and firing the same.

26. A process according to claim 25 which additionally comprises the following steps between steps (c) and (d) of claim 25:

e. overprinting the seal ring deposited on step (b) and fired in step (c) a gold overprint layer of gold powder in an inert vehicle, said gold powder comprising spherical particles having a diameter within the range 1–10 microns, the powder having a bulk density within the range 5–9 g./cc., and f. firing said gold overprint layer to sinter the same.

27. Process according to claim 26 wherein the metallizing composition deposited in step (b) additionally comprises 0.5–5 percent by weight glass frit, and said frit consists essentially of by weight 20–38% $SiO_2$
21–45% PbO
1–25% $Al_2O_3$
2–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$.

28. A process according to claim 25 which additionally comprises, between step (b) and (c), the step of overprinting the unfired seal ring deposited in step (b) a gold overprint layer of gold powder in an inert vehicle, said gold powder comprising spherical particles having a diameter within the range 1–10 microns, the powder having a bulk density within the range 5–9 g./cc.

29. A process according to claim 28 wherein the metallizing composition deposited in step (b) additionally comprises 0.5–5 percent by weight glass frit, and said frit consists essentially of 20–38% $SiO_2$
21–45% PbO
1–25% $Al_2O_3$
2–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$.

30. A process according to claim 25 wherein the metallizing composition deposited in step (b) additionally comprises 0.5–5 percent by weight glass frit, and said frit consists essentially of by weight 20–38% $SiO_2$
21–45% PbO
1–25% $Al_2O_3$
2–20% $TiO_2$
2–15% BaO
0–25% ZnO
0–15% $PbF_2$
0–5% SrO
0–5% $ZrO_2$
0–5% $Ta_2O_5$
0–5% $WO_3$
0–5% CdO
0–5% $SnO_2$
0–5% $Sb_2O_3$.

* * * * *